United States Patent [19]

Morioka et al.

[11] Patent Number: 4,918,928
[45] Date of Patent: Apr. 24, 1990

[54] APPARATUS FOR TESTING IC DEVICES AT LOW TEMPERATURE AND COOLING BAG FOR USE IN TESTING IC DEVICES AT LOW TEMPERATURE

[75] Inventors: Osamu Morioka, Kakogawa; Keizo Tokushige, Matsubara; Akeo Kimura, Iruma; Takahiro Nihei, Fukushima, all of Japan

[73] Assignees: Kabushiki Kaisha Kobe Seikosho, Kobe; Japan LSI Co., Ltd., Tokyo, both of Japan

[21] Appl. No.: 284,547

[22] Filed: Dec. 15, 1988

[30] Foreign Application Priority Data

Dec. 17, 1987 [JP] Japan ............................ 62-319761
Dec. 17, 1987 [JP] Japan ............................ 62-191985[U]
Dec. 17, 1987 [JP] Japan ............................ 62-191986[U]
May 30, 1988 [JP] Japan ............................ 63-72270[U]

[51] Int. Cl.$^5$ ............................................. F25B 19/00
[52] U.S. Cl. ...................................... 62/51.1; 62/383; 174/15.1
[58] Field of Search ................. 62/383, 514 R, 51.1; 174/15.1

[56] References Cited

U.S. PATENT DOCUMENTS 3,611,745 10/1971 Schlemmer ..................... 12/514 R
3,705,500 12/1972 Jehle ................................. 62/514 R
4,261,183 4/1981 Plomp ................................. 62/383

FOREIGN PATENT DOCUMENTS 61-161462 7/1986 Japan.

Primary Examiner—Ronald C. Capossela
Attorney, Agent, or Firm—Oblon, Spivak, McClelland, Maier & Neustadt

[57] ABSTRACT

An apparatus for testing IC devices for performance at a low temperature comprises a cooling disk disposed within a test chamber and adapted to be cooled with liquid nitrogen of like refrigerant for cooling the IC device in contact or proximity therewith. A cooling bag for use as cooling means in testing IC devices at a low temperature comprises a bag adapted to intimately contact the IC device and having a refrigerant enclosed therein. Another apparatus for testing IC devices at a low temperature comprises a cooling bag reeved around a drive roller and an idler roller in the form of a belt conveyor and adapted to come into intimate contact from above with IC devices being transported on a conveyor to cool the devices.

8 Claims, 8 Drawing Sheets

APPARATUS FOR TESTING IC DEVICES AT LOW TEMPERATURE AND COOLING BAG FOR USE IN TESTING IC DEVICES AT LOW TEMPERATURE

BACKGROUND OF THE INVENTION AND RELATED ART STATEMENT

The present invention relates to apparatus for testing IC devices for performance at a low temperature and to cooling bags for use as cooling means in testing IC devices at a low temperature.

So-called IC handlers are already known as apparatuses for testing IC devices for performance at a predetermined temperature condition using an IC tester. However, these apparatuses are usable only for testing at room temperature or high temperatures, so that when IC devices are to be tested at a low temperature, the IC device is placed on the head of the IC tester with an iron plate interposed therebetween, and liquid nitrogen or like refrigerant is applied to the device.

This method nevertheless has the following drawbacks.

(a) The water vapor in air condenses on or frosts the cooled IC device cause to short-circuit the device.

(b) The method encounters difficulties in controlling the temperature because of marked changes in temperature and further because it is difficult to accurately detect the temperature with a temperature sensor, hence inaccurate test results. The method is not amenable to a continuous operation since the operation needs to be interrupted frequently for the adjustment of temperature.

(c) The IC device has surface irregularities, and the surface of the IC device differs in cooling condition from portion to portion according to the direction in which the refrigerant is applied, so that it is difficult to cool the device uniformly in its entirety. Consequently, uneven cooling locally produces thermal stress (thermal expansion or contraction) to cause damage to the device.

SUMMARY OF THE INVENTION

An object of the present invention is to overcome the above drawbacks and to provide an apparatus for testing IC devices at a low temperature and a cooling bag for use in testing IC devices at a low temperature.

Other objects and advantages of the invention will become apparent from the following description.

The present invention provides an apparatus for testing IC devices at a low temperature which comprises a test chamber for accommodating therein the IC device to be tested for performance, a cooling disk disposed within the test chamber for cooling the IC device in contact or proximity therewith, and means for supplying a refrigerant to the interior of the test chamber and the cooling disk for cooling the chamber and the disk.

With this apparatus, the IC device is cooled by the cooling disk within the test chamber which is filled with a refrigerant and maintained at a low temperature in a dry state, so that the IC device is free of frosting or condensation. The cooling disk acts to cool the device with good stability and with reduced variations in temperature while permitting a temperature sensor to detect the temperature accurately for easy temperature control. Consequently, IC devices can be tested with high accuracy under a constant temperature condition by a continuous operation.

The invention further provides an apparatus of the construction described above wherein an inlet and an outlet for IC devices are formed in the respective side walls of the test chamber, and the test chamber is provided adjacent thereto with a pretreatment chamber at its inlet side and an aftertreatment chamber at its outlet side. The apparatus further comprises means for supplying a low-temperature dry gas to the two treatment chambers to maintain the treatment chambers in a dry state at a temperature higher than the internal temperature of the test chamber but lower than room temperature.

Because of this construction, the IC device to be placed into the test chamber can be precooled and, at the same time, covered with the low-temperature dry gas over its surface in the pretreatment chamber so as to lower the dew point. Further before the device is withdrawn from the test chamber after testing, the device is subjected to a higher temperature in the aftertreatment chamber, whereby the difference in temperature between the device and the outside can be reduced. Consequently, the IC device can be made free of frosting or condensation more effectively during and after testing.

According to the invention, the cooling disk is in the form of a ring having opposite ends and internally has a refrigerant channel.

The cooling disk can therefore be cooled efficiently from inside with the refrigerant flowing through the channel.

Further according to the invention, a turntable for placing the IC device thereon is disposed under the cooling disk within the test chamber and is rotatable about a vertical axis.

The IC device can then be moved in a specified direction by the turntable and tested while being cooled by the cooling disk during the movement.

The apparatus of the invention further has a stirring blower disposed above the cooling disk within the test chamber.

The refrigerant gas within the chamber is stirred by the blower, whereby the whole interior of the test chamber can be cooled uniformly.

The invention provides another apparatus for testing IC devices at a low temperature which comprises a test chamber for accommodating therein the IC device to be tested for performance, a blow nozzle for forcing a refrigerant into the test chamber from outside, a tray for receiving the refrigerant as forced out from the blow nozzle in the form of a liquid, gas circulation means for circulating the refrigerant in the form of a gas within the test chamber through a path over the tray to cool the interior of the test chamber, and a cooling disk to be cooled by the gas circulation means for cooling the IC device in contact or proximity therewith.

With this apparatus, the cooling disk is cooled in its entirety to substantially the same temperature as the interior of the test chamber by the indirect cooling action of a flow of circulating gas. This obviates the problem that could arise when the cooling disk is cooled independently with a refrigerant passed therethrough as in the foregoing case, i.e., the problem that an uneven flow of refrigerant through the disk locally overcools the disk to thereby frost the surface of the IC device or create a stress due to thermal contraction.

The invention further provides an apparatus of the disk indirect cooling type wherein the gas circulation means and the blow nozzle are so arranged that the flow of circulating gas produced by the gas circulation means is perpendicular to and intersects the direction in which the refrigerant is forced out from the blow nozzle.

The refrigerant forced out can then be diffused efficiently, while the refrigerant on the tray can be vaporized also efficiently.

Further according to the invention, the tray is provided with a diffuser plate on the downstream side thereof with respect to the flow of circulating gas.

With this construction, the flow of circulating gas over the tray can be separated by the diffuser plate toward its opposite ends, with the result that the cold gas can be diffused through the entire interior of the test chamber efficiently.

The invention further provides a cooling bag for testing IC devices for performance by cooling the device in contact therewith. The bag has at least one flexible side adapted to intimately contact the IC device and has liquid nitrogen or like refrigerant enclosed therein.

The IC device can be cooled efficiently and uniformly in its entirety by the bag in intimate contact with the surface of the device. The bag in intimate contact with the device shields the device from air, thereby precluding frosting or condensation. The temperature is easy to control because the refrigerant does not diffuse and further because the cooling temperature is dependent on the temperature of the refrigerant. Accordingly, the cooling temperature can be determined or altered as desired by selecting a suitable refrigerant or selectively using one of different cooling bags containing different refrigerants.

The invention further provides an apparatus for testing IC devices at a low temperature which comprises such a cooling bag provided above a conveyor for transporting the IC devices. The cooling bag is in the form of a hollow endless belt and has liquid nitrogen or like refrigerant enclosed therein. The bag is reeved around a drive roller and an idler roller and is rotatable in the same direction as the conveyor.

With this apparatus, IC devices can be tested at a low temperature while being transported on the conveyor.

DESCRIPTION OF THE PREFERRED EMBODIMENTS

Figure 1:
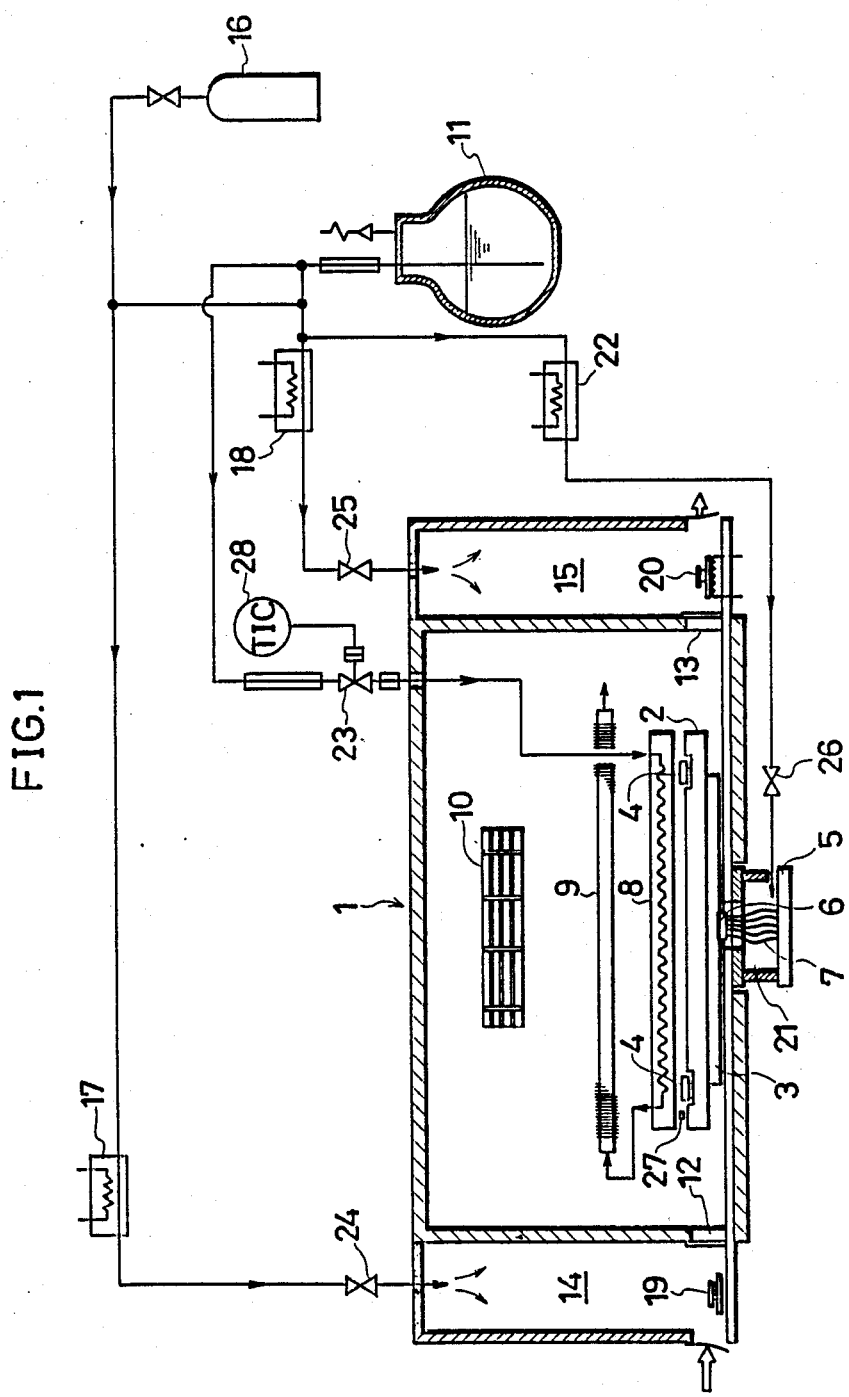
FIG. 1 is a view in vertical section schematically showing an apparatus embodying the invention for testing IC devices at a low temperature.
Figure 2:
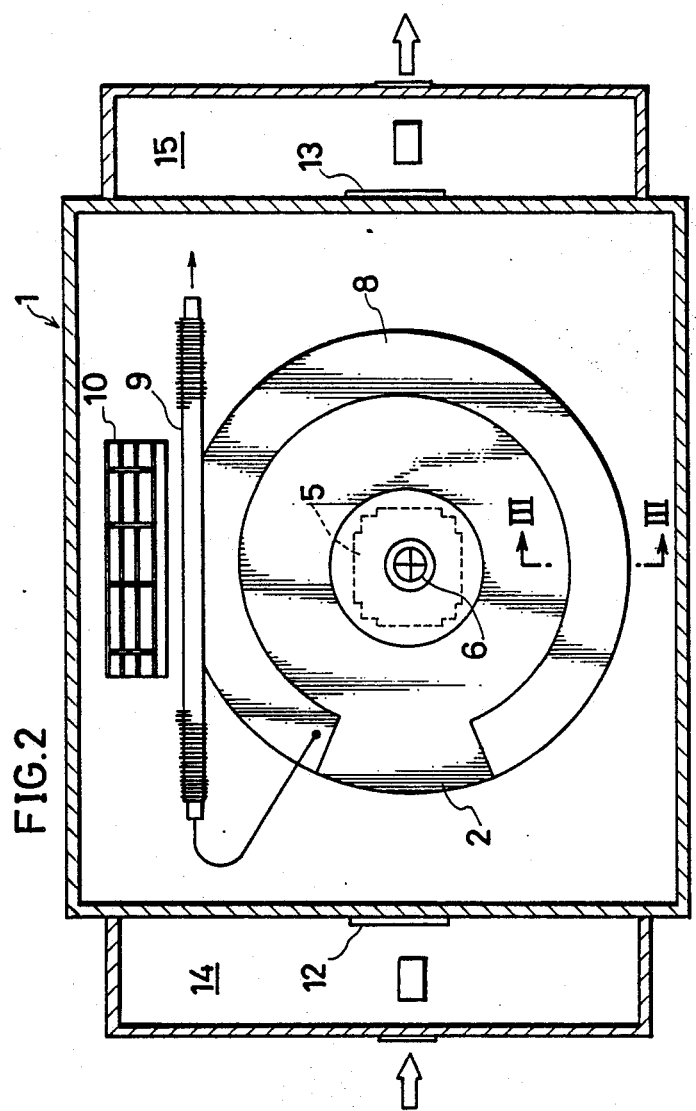
FIG. 2 is a view in horizontal section of the same.
Figure 3:
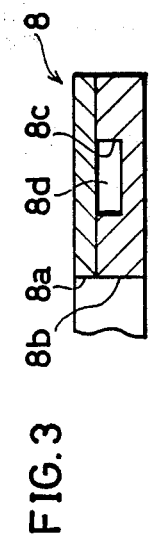
FIG. 3 is an enlarged view in section taken along the line III—III in FIG. 2.

With reference to FIGS. 1 to 3, a test chamber 1 is in the form of a rectangular parallelepipedal box and has at its bottom a turntable 2 supported by a swivel bearing 3 and rotatable about a vertical axis. IC devices 4 to be tested are placed on the turntable 2, as arranged at a specified spacing circumferentially thereof. The IC devices 4 are electrically connected to the head 5 of an IC tester provided on the outer side of bottom wall of the chamber 1 centrally thereof, by the turntable 2, a socket 6 and wiring 7. The IC devices are tested for performance at a low temperature by the IC tester.

The test chamber 1 is provided inside thereof with a cooling disk 8 in the form of a ring having opposite ends and disposed above the turntable 2, a heat exchanger 9 positioned above the cooling disk 8, and a stirring blower 10 disposed above the heat exchanger 9 closer to the rear wall of the chamber.

With reference to FIG. 3, the cooling disk 8 comprises two annular metal plates 8a, 8b partly cut out, made of heat conductive metal material such as stainless steel and joined together. The metal plate 8b has a circumferential groove 8c in one side thereof to be joined to the other plate 8a. When the two metal plates are joined together, the groove 8c is closed to provide a refrigerant channel 8d.

Liquid nitrogen serving as a refrigerant is supplied to the channel 8d from a tank 11 disposed outside the test chamber 1, whereby the cooling disk 8 is cooled. The IC devices 4 are cooled by the cooling disk 8.

The disk 8 can be cooled efficiently since it is cooled from inside with the liquid nitrogen flowing through the channel 8d.

The cooling disk 8 may be in intimate contact with the IC devices 4 or spaced therefrom by a small distance. To prevent overcooling of the IC devices 4 by the disk 8 when the disk is in intimate contact therewith, the surface of the disk 8 may be covered with Teflon, silicone resin or the like.

The liquid nitrogen passing through the disk 8 enters the heat exchanger 9. The interior of the test chamber 1 is cooled by the heat exchange operation of the exchanger 9 and with the nitrogen gas released from an outlet of the exchanger 9.

Furthermore, the whole interior of the test chamber 1 is uniformly cooled by the operation of the blower 10 which stirs the gas within the chamber 1, whereby the ambient temperature is uniformly maintained around the plurality of IC devices 4 on the turntable 2.

When heated, the nitrogen gas is discharged from the chamber via an unillustrated gas discharge line. A heater for heating the interior of the test chamber 1 may be provided for preventing overcooling of the interior.

An inlet 12 for IC devices is formed in one side wall of the test chamber 1, and an outlet 12 for the IC devices in the other side wall thereof.

The IC devices 4 are revolved from the inlet side toward the outlet side by the turntable 2 and tested for performance at a specified low temperature during this movement.

The test chamber 1 is provided adjacent thereto with a pretreatment chamber 14 at its inlet (12) side and an aftertreatment chamber 15 at its outlet (13) side. Nitrogen gas as heated by heaters 17, 18 is supplied to the two treatment chambers 14, 15 from a nitrogen gas tank 16 to thereby maintain the chambers 14, 15 in a dry state at a temperature lower than room temperature but higher than the internal temperature of the test chamber 1.

The following advantages are afforded by the two treatment chambers 14, 15 which are provided at the inlet side and the outlet side of the test chamber 1 and which serve as drying chambers having a temperature intermediate between the inside and outside temperatures of the test chamber 1.

(I) Ingress of outside air into the test chamber 1 can be prevented.

(II) The IC device to be placed into the test chamber 1 can be precooled and, at the same time, covered with dry nitrogen gas over the surface in the pretreatment chamber 14 to lower the dew point.

(III) Before the IC device 4 tested is withdrawn from the test chamber 1, the device can be subjected to a higher temperature in the aftertreatment chamber 15 to diminish the temperature difference involved relative to the outside.

By virtue of these advantages, the IC device 4 can be effectively made free of frosting or condensation during testing within the chamber 1 and also after the testing.

To prevent ingress of air into the test chamber 1 and the treatment chambers 14, 15 more effectively, these chambers are maintained at a pressure slightly higher than atmospheric pressure. The two treatment chambers 14, 15 are provided with plate heaters 19, 20, respectively, as auxiliary heating and drying means. On the other hand, a small compartment 21 is formed between the top face of the tester head 5 and the outer surface of bottom wall of the test chamber 1. Nitrogen gas as heated by a heater 22 is supplied to the compartment 21 from the nitrogen gas tank 16 to prevent deposition of frost or condensed water on the tester head 5. Further the chambers 1, 14, 15 are covered with a heat insulating material for heat insulation.

Shutoff valves 23, 24, 25, 26 are provided respectively on the liquid nitrogen supply line for the cooling disk 8 and the test chamber 1, the nitrogen gas supply lines for the treatment chambers 14, 15, and the nitrogen gas supply line for the small compartment 21. The temperature of the cooling disk 8 and the internal temperature of the chambers 1, 14, 15 and the compartment 21 are controlled by controlling the supplies of the liquid nitrogen and nitrogen gas with these valves 23 to 26.

Of these, the shutoff valve 23 on the liquid nitrogen supply line is automatically controlled by a controller 28 in response to a signal from a temperature sensor 27 for detecting the temperature of the cooling disk 8, whereby the cooling temperature of IC devices 4 is automatically controlled to the specified level. Unlike the conventional method wherein nitrogen is applied in air at room temperature, the present apparatus is so adapted that the IC device 4 is cooled by the cooling disk 8 in the low-temperature atmosphere of the test chamber 1. This permits the IC device 4 to be cooled at a stabilized temperature and renders the temperature sensor 27 free of frosting or condensation of water vapor like the IC device for accurate temperature detection. Consequently, the cooling temperature can be controlled automatically although this has been difficult or impossible with the conventional method. Furthermore, the automatic temperature control thus assured makes the apparatus operable continuously.

Although the liquid nitrogen passed through the cooling disk 8 is supplied to the interior of the test chamber 1 through the heat exchanger 9 according to the foregoing embodiment, the refrigerant may be supplied to the disk 8 and the heat exchanger 9 through separate lines. Although the heat exchanger 9 and the blower 10 are very effective for maintaining the entire interior of the test chamber 1 at a uniform temperature, comparable results can be achieved, for example, by an expedient for supplying the refrigerant into the test chamber from many portions without using these means. Furthermore, cooled methanol, Freon or the like may be used in place of the liquid nitrogen and nitrogen gas used in the above embodiment, as the refrigerant to be supplied to the cooling disk 8 and the test chamber 1 and the low-temperature dry gas to be supplied to the two treatment chambers 14, 15.

With the present testing apparatus, the IC device 4 is cooled by the cooling disk 8 within the test chamber 1 which has a low temperature, is dry and is filled with the refrigerant, so that the device can be free of frosting or condensation.

Additionally, the IC device 4 to be transported into the test chamber 1 is precooled and, at the same time, covered with dry gas over the surface in the pretreatment chamber 14 to lower the dew point, while the device tested is heated in the aftertreatment chamber 15 before being delivered from the test chamber to thereby diminish the difference in temperature between the device and the outside. This serves to preclude deposition of frost or condensate on the device more effectively.

Because the cooling disk 8 performs a stabilized cooling operation in the low-temperature atmosphere and further because the temperature sensor 27 accurately detects the temperature, the temperature is controllable with ease although this has been difficult with the conventional method wherein nitrogen is applied to the IC device in air at room temperature. Consequently, IC devices 4 can be tested with improved accuracy by a continuous operation.

The apparatus of the foregoing embodiment has a problem in that an uneven flow of refrigerant through the cooling disk 8 is likely to locally overcool the disk 8. The cooling disk, when thus overcooled, is likely to permit the IC device to be frosted or to develop strain due to thermal contraction.

Figure 4:
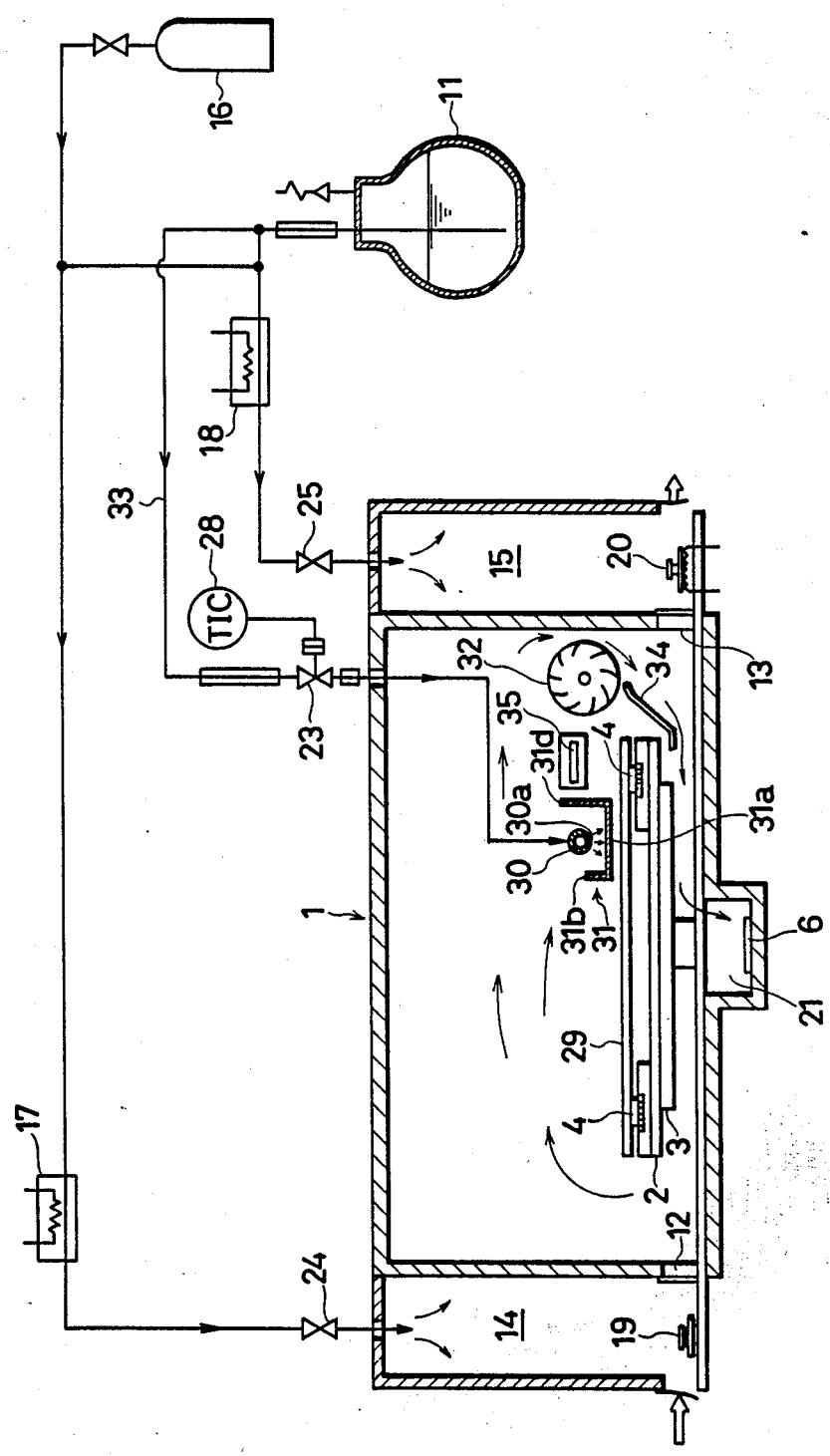
FIG. 4 is a sectional view schematically showing another embodiment of the invention.
Figure 5:
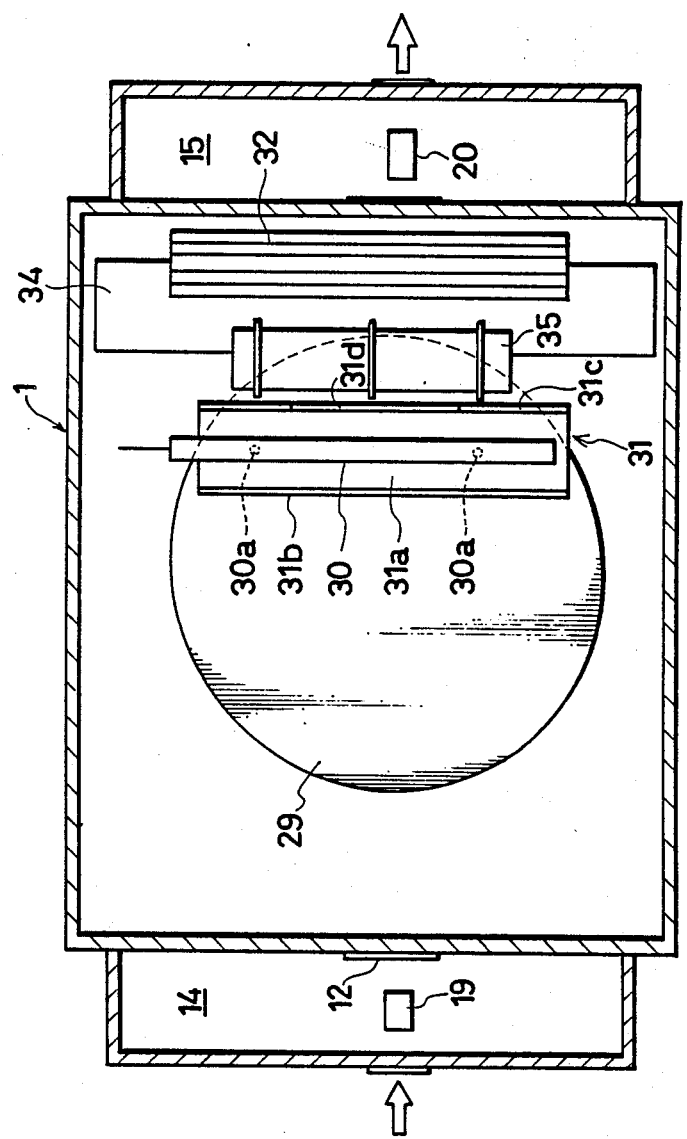
FIG. 5 is a view in horizontal section of the same.
Figure 6:
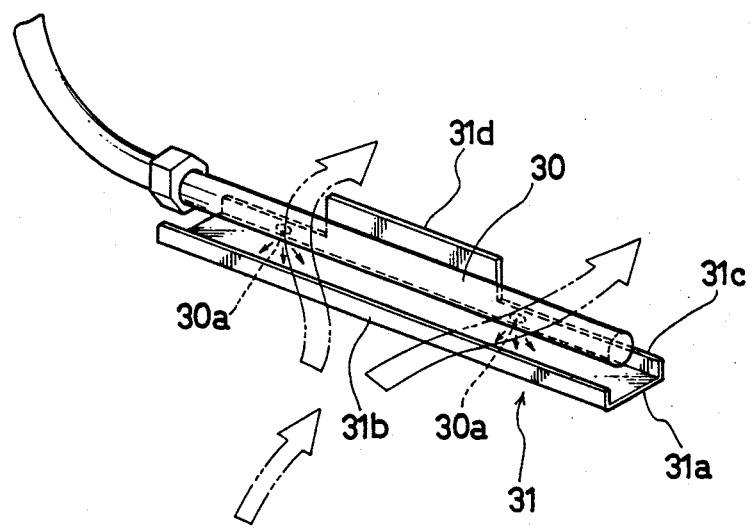
FIG. 6 is an enlarged perspective view of a blow nozzle and a tray included in the embodiment.

FIGS. 4 to 6 show an embodiment of the invention which is adapted to overcome this problem.

Throughout FIGS. 1 to 6, like parts are designated by like reference numerals and will not be described repeatedly.

Above the turntable 2 for placing IC devices 4 thereon, the test chamber 1 is provided with a cooling disk 29 for cooling the devices 4 in contact or proximity therewith, a blow nozzle 30, a tray 31 and a blower 32 such as a sirocco fan.

The blow nozzle 30 has a plurality of orifices 30a and is disposed horizontally above the disk 29 within the test chamber 1, with the orifices 30a oriented downward.

The tray 31 is positioned horizontally immediately below the nozzle 30 in parallel therewith and is opposed to the orifices 30a.

The blower 32 is disposed at one side of the nozzle 30. Rotation of the blower 32 produces a flow of gas circulating substantially through the entire interior of the chamber 1 including the small compartment 21 as indicated by arrows in FIG. 4 while passing over and intersecting the nozzle 30 and the tray 31 perpendicular thereto.

With the present embodiment, the socket 6 connected to an IC tester (not shown) is provided at the bottom of the small compartment 21 and electrically connected to the IC devices 4 by unillustrated wiring, swivel bearing 3 and turntable 2.

The blow nozzle 30 is connected to the liquid nitrogen tank 11 via a liquid nitrogen supply line 33. The liquid nitrogen within the tank 11 is forced out downward into the test chamber 1 from the orifices 30a of the nozzle 30. A portion of the liquid nitrogen vaporizes simultaneously when it is forced out, and another portion thereof also vaporizes upon striking against the tray 31. The remaining portion on the tray 31 is vaporized by contact with the flow of circulating gas produced by the blower 32.

In this way, cold nitrogen gas is circulated through the test chamber 1, whereby the interior of the chamber 1 is almost uniformly cooled in its entirety. The IC devices 4 are cooled by the cooling disk 29 which is cooled approximately to the same temperature as the internal temperature of the test chamber.

Thus, the cooling disk 29 is not cooled directly with liquid nitrogen passed therethrough but is cooled indirectly with the atmosphere (within the test chamber 1) which is cooled by the circulating gas flow, with the result that the disk 29 is cooled to a uniform temperature in its entirety without the likelihood of local overcooling. This eliminates the likelihood that the cooling disk 29, when overcooled, will permit deposition of frost on the surface of IC devices 4 or give rise to strain due to thermal contraction.

Furthermore, the circulating gas flow produced by the blower 32 is caused to intersect the direction in which the liquid nitrogen is forced out from the blow nozzle, at right angles therewith. This permits the nitrogen gas forced out to be efficiently diffused through the chamber 1, further assuring efficient vaporization of the liquid nitrogen on the tray 31.

To cause the nitrogen gas to flow through the entire interior of the test chamber 1 including the small compartment 21 without allowing the gas to directly strike on the cooling disk 29, a deflecting guide plate 34 is disposed under the blower 32 for guiding the gas flow downward.

The tray 31 comprises a bottom wall 31a for receiving the liquid nitrogen from the nozzle 30 to cause the liquid to vaporize, side walls 31b, 31c along the respective sides of the bottom wall for preventing the liquid nitrogen from sputtering before vaporization, and a diffuser plate 31d extending upward from the middle portion of the side wall 31c. The circulating gas flow over the tray 31 can be separated by the diffuser plate 31d laterally toward its opposite ends, with the result that the cold gas can be diffused through the entire interior of the test chamber 1 efficiently.

Indicated at 35 in FIGS. 4 and 5 is a heater for heating the interior of the test chamber 1 for accurately controlling the internal temperature thereof.

Figure 7:
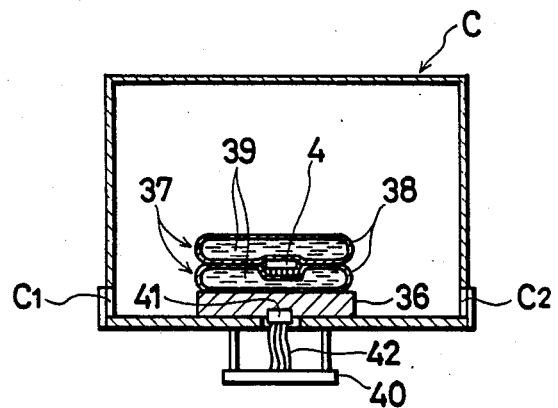
FIG. 7 is a sectional view showing cooling bags embodying the invention for testing IC devices at a low temperature.
Figure 8:
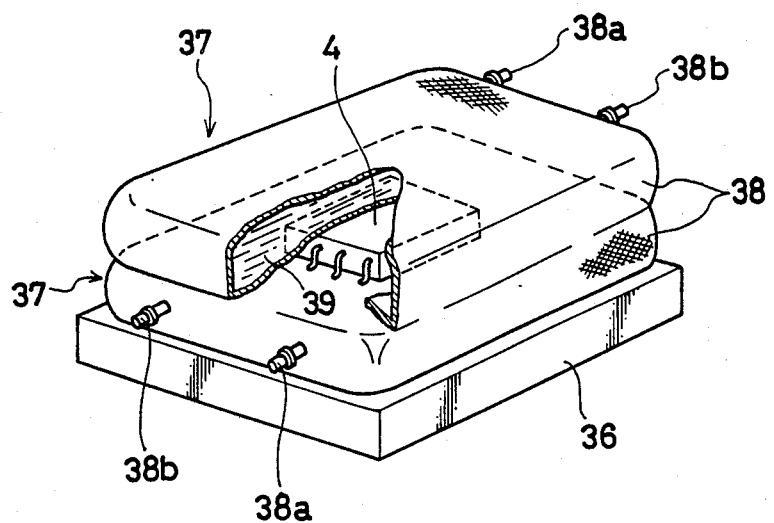
FIG. 8 is an enlarged perspective view partly broken away and showing the same.

A cooling bag embodying the invention for use in testing IC devices at a low temperature will be described next with reference to FIGS. 7 and 8.

The cooling bag of this embodiment is used when an IC device 4 is tested for performance as accommodated in a test chamber C which is maintained at a low temperature in a dry state.

The test chamber 1 already described with reference to the above embodiments is usable as the test chamber C, which however is shown as simplified.

The test chamber C has in its interior a base 36 at its bottom. The IC device 4 placed into the chamber C through an inlet C1 is held between a pair of upper and lower cooling bags 37, 37 on the base 36 and thereby cooled.

Each of the cooling bags 37, 37 (see FIG. 8) comprises a flat bag member 38 having heat conductivity and flexibility and filled with liquid nitrogen or like refrigerant 39.

The bag member 38 is made of a fabric knitted or woven of thin strips of heat conductive metal such as stainless steel and is prepared by subjecting the fabric to a leakproof treatment as with Teflon or the like and making the fabric into a flat bag. The bag member 38 has an injection opening 38a and a discharge opening 38b. The refrigerant 39 is filled into the bag member through the injection opening 38a. When the refrigerant 39 becomes heated by cooling the device 4, the refrigerant 39 is drawn off through the discharge opening 38b for replacement by cold refrigerant.

Thus, the bag member 38 is flexible and freely deformable, so that when the IC device 4 is held between the cooling bags 37, 37 and pressed on from above and below, the bag members 38, 38 deform along the surface irregularities of the device 4 in intimage contact therewith.

Accordingly, the cold of the refrigerant 39 can be delivered to the entire surface area of the IC device 4 uniformly without the loss of cold to assure efficient cooling. Furthermore, the IC device 4 can be cooled at a uniform temperature in its entirety without irregurailties in temperature. This precludes the likelihood that a thermal stress will occur locally in the device 4. The bag members 38 which are in intimate contact with the device 4 shield the device 4 from air, rendering the device 4 free of frosting or condensation of water vapor.

To assure more intimate contact, the upper cooling bag 37 may be pressed on from above by a jig.

On the other hand, the temperature of the IC device 4 can be controlled easily because the refrigerant 39 does not diffuse and further because the temperature (cooling capacity) of the cooling bag 37 is dependent on the refrigerant 39. Consequently, the device 4 can be maintained accurately at the specified testing temperature to achieve an accurate test result. Moreover, the temperature of the cooling bag 37, i.e., the temperature at which the IC device 4 is to be cooled, can be determined or altered as desired by selecting a suitable kind of refrigerant 39 (e.g., liquid nitrogen, Freon, methanol or the like) for filling the bag 38, or by changing the refrigerant 39.

In this case, the refrigerant 39 may be replaced by another one according to the contemplated change in the cooling temperature (testing temperature), or one of different cooling bags containing different kinds of refrigerants 39 and already prepared may be selectively used according to the desired testing temperature.

The IC device 4 is electrically connected to the head 40 of an IC tester provided on the outer side of bottom wall of the test chamber C through the base 36, socket 41 and wiring 42, and is tested for performance at a low temperature by the IC tester. Indicated at C2 is an outlet through which the IC device 4 is withdrawn from the test chamber C after the testing.

The pair of cooling bags 37 and the base 36 may be large-sized so that a plurality of IC devices can be cooled at a time in a large test chamber. The IC device 4 may be cooled on one side thereof only with one cooling bag 37.

The bag member need not always be made of metal such as stainless steel but can be made of various plastics or rubbers having heat conductivity and flexibility. Although it is desirable that the bag member be provided with the refrigerant injection opening and discharge opening for replenishing, changing or reusing the refrigerant, the cooling bag, if small-sized, may be made disposable with the refrigerant therein completely sealed off without providing any injection or discharge opening.

Another apparatus of the invention will be described below which includes a cooling bag for use in testing IC devices at a low temperature.

Figure 9:
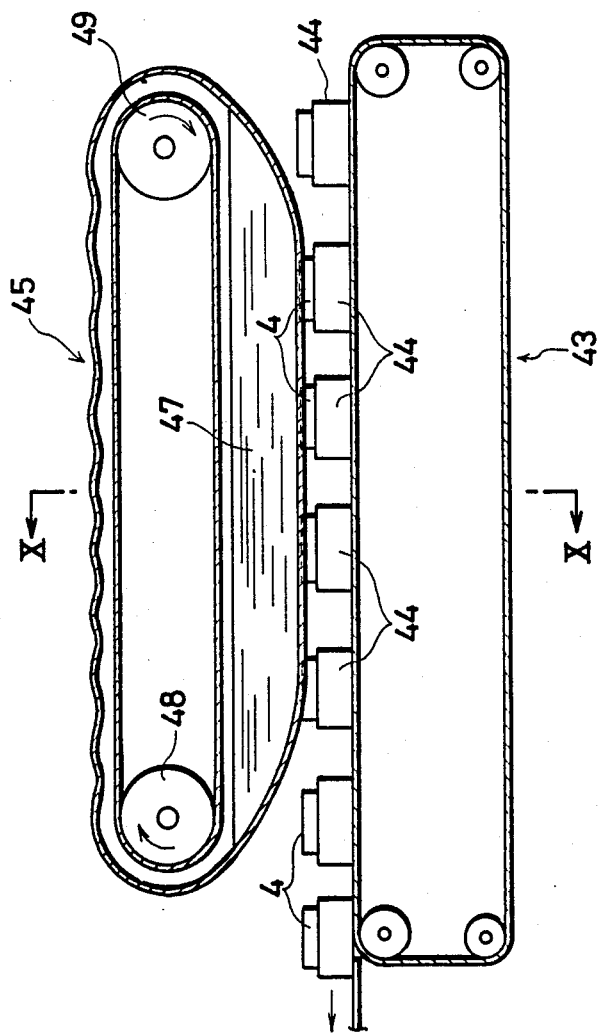
FIG. 9 is a view in vertical section of an apparatus embodying the invention and including the cooling bag for testing IC devices at a low temperature.
Figure 10:
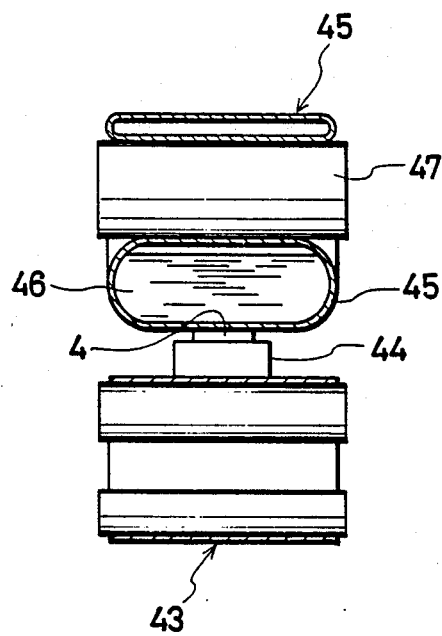
FIG. 10 is a view in section taken along the line X—X in FIG. 9.

FIGS. 9 and 10 show this apparatus, which is used for testing a multiplicity of IC devices for performance while they are cooled one after another during transport in a given direction.

IC devices 4 resting on containers 44 are transported in one direction by a transport conveyor 43 and are cooled during the transport when coming into intimate contact with a cooling bag 45 disposed above the conveyor 43.

The cooling bag 45 comprises a bag member 46 in the form of a hollow endless belt and having a refrigerant 47 enclosed therein. The bag 45 is reeved around a drive roller 48 and an idler roller 49 like a belt conveyor and can be driven in the same direction and at the same speed as the IC devices 4. To prevent the cooling bag 45 from slipping, it is desirable to form the drive and idler rollers 48, 49 each in the form of a gear and to attach to the inner side of the bag member 46 a rack sheet having teeth meshable with the rollers 48, 49 although not shown. The bag member then will not be flexible on its inner side but retains flexibility on its outer side so as to be brought into contact with the IC devices 4. Thus the bag 45 can be in intimate contact with the devices 4 without any problems arising.

With this apparatus, IC devices 4 can be tested for performance at a low temperature while being transported, and hence a simplified testing procedure is possible.

What is claimed is:

1. An apparatus for testing IC devices at a low temperature characterized in that the apparatus comprises a test chamber for accommodating therein the IC device to be tested for performance, a cooling disk disposed within the test chamber for cooling the IC device in contact or proximity therewith, and means for supplying a refrigerant to the interior of the test chamber and interior of said cooling disk for cooling the chamber and the disk.

2. An apparatus for testing IC devices at a low temperature characterized in that the apparatus comprises a test chamber for accommodating therein the IC device to be tested for performance, a cooling disk disposed within the test chamber for cooling the IC device in contact or proximity therewith, and means for supplying a refrigerant to the interior of the test chamber and the interior of the cooling disk for cooling the chamber and the disk wherein an inlet and an outlet for the IC device are formed in the respective side walls of the test chamber, and the test chamber is provided adjacent thereto with a pretreatment chamber at its inlet side and an aftertreatment chamber at its outlet side, the apparatus further comprising means for supplying a low-temperature dry gas to the two treatment chambers to maintain the treatment chambers in a dry state at a temperature higher than the internal temperature of the test chamber but lower than room temperature.

3. An apparatus for testing IC devices at a low temperature characterized in that the apparatus comprises a test chamber for accommodating therein the IC device to be tested for performance, a cooling disk disposed within the test chamber for cooling the IC device in contact or proximity therewith, and means for supplying a refrigerant to the interior of the test chamber and the interior of the cooling disk for cooling the chamber and the disk wherein the cooling disk is in the form of a ring having opposite ends and internally has a refrigerant channel.

4. An apparatus for testing IC devices at a low temperature characterized in that the apparatus comprises a test chamber for accommodating therein the IC device to be tested for performance, a cooling disk disposed within the test chamber for cooling the IC device in contact or proximity therewith, and means for supplying a refrigerant to the interior of the test chamber and the interior of the cooling disk for cooling the chamber and the interior of the disk wherein a turntable for placing the IC device thereon is disposed under the cooling disk within the test chamber and is rotatable about a vertical axis.

5. An apparatus for testing IC devices at a low temperature characterized in that the apparatus comprises a test chamber for accommodating therein the IC device to be tested for performance, a cooling disk disposed within the test chamber for cooling the IC device in contact or proximity therewith, and means for supplying a refrigerant to the interior of the test chamber and the interior of the cooling disk for cooling the chamber and the disk wherein a stirring blower is disposed above the cooling disk within the test chamber.

6. An apparatus for testing IC devices at a low temperature characterized in that the apparatus comprises a test chamber for accommodating therein the IC device to be tested for performance, a blow nozzle for forcing a refrigerant into the test chamber from outside, a tray for receiving the refrigerant as forced out from the blow nozzle in the form of a liquid, gas circulation means for circulating the refrigerant in the form of a gas within the test chamber through a path over the tray to cool the interior of the test chamber, and a cooling disk to be cooled by the gas circulation means for cooling the IC device in contact or proximity therewith.

7. An apparatus as defined in claim 6 wherein the gas circulation means and the blow nozzle are so arranged that the flow of circulating gas produced by the gas circulation means is perpendicular to and intersects the direction in which the refrigerant is forced out from the blow nozzle.

8. An apparatus as defined in claim 6 or 7 wherein the tray is provided with a diffuser plate on the downstream side thereof with respect to the flow of circulating gas.

* * * * *